United States Patent
Kawamura et al.

(10) Patent No.: US 11,056,165 B2
(45) Date of Patent: Jul. 6, 2021

(54) CELL-SPECIFIC REFERENCE GENERATION AND SENSING

(71) Applicant: Micron Technology, Inc., Boise, ID (US)

(72) Inventors: Christopher John Kawamura, Boise, ID (US); Scott James Derner, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/893,304

(22) Filed: Jun. 4, 2020

(65) Prior Publication Data

US 2021/0005239 A1     Jan. 7, 2021

Related U.S. Application Data

(63) Continuation of application No. 16/387,159, filed on Apr. 17, 2019, now Pat. No. 10,706,907, which is a continuation of application No. 15/692,994, filed on Aug. 31, 2017, now Pat. No. 10,311,934, which is a continuation of application No. 15/071,490, filed on Mar. 16, 2016, now Pat. No. 9,786,347.

(51) Int. Cl.
  *G11C 11/22*      (2006.01)
  *G11C 7/14*       (2006.01)

(52) U.S. Cl.
  CPC ............ *G11C 11/2273* (2013.01); *G11C 7/14* (2013.01); *G11C 11/221* (2013.01); *G11C 11/2293* (2013.01)

(58) Field of Classification Search
  CPC ... G11C 11/22; G11C 11/223; G11C 11/2273; G11C 7/14; G11C 11/221; G11C 11/2293
  See application file for complete search history.

(56) References Cited

U.S. PATENT DOCUMENTS

| | | | |
|---|---|---|---|
| 6,898,108 B2 | 5/2005 | Kato et al. | |
| 7,042,754 B2 | 5/2006 | Mukaiyama | |
| 7,561,458 B2 | 7/2009 | Madan | |
| 9,135,994 B2 | 9/2015 | Kwon et al. | |
| 2003/0206430 A1 | 11/2003 | Ho | |
| 2006/0146625 A1 | 7/2006 | Morita | |
| 2009/0303771 A1* | 12/2009 | Kang | G11C 7/22 365/145 |
| 2010/0128515 A1 | 5/2010 | Fukushi | |
| 2014/0198589 A1* | 7/2014 | Mok | G11C 7/12 365/189.11 |

* cited by examiner

*Primary Examiner* — Han Yang
(74) *Attorney, Agent, or Firm* — Holland & Hart LLP

(57) ABSTRACT

Methods, systems, and devices for operating a ferroelectric memory cell or cells are described. A portion of charge of a memory cell may be captured and, for example, stored using a capacitor or intrinsic capacitance of the memory array that includes the memory cell. The memory cell may be recharged (e.g., re-written). The memory cell may then be read, and a voltage of the memory cell may be compared to a voltage resulting from the captured charge. A logic state of the memory cell may be determined based at least in part on the voltage comparison.

20 Claims, 9 Drawing Sheets

US 11,056,165 B2

CELL-SPECIFIC REFERENCE GENERATION AND SENSING

CROSS REFERENCE

The present application for patent is a continuation of U.S. patent application Ser. No. 16/387,159 by Kawamura et al., entitled "Cell-Specific Reference Generation and Sensing," filed Apr. 17, 2019, which is a continuation of U.S. patent application Ser. No. 15/692,994 by Kawamura et al., entitled "Cell-Specific Reference Generation and Sensing," filed Aug. 31, 2017, which is a continuation of U.S. patent application Ser. No. 15/071,490 by Kawamura et al., entitled "Cell-Specific Reference Generation and Sensing," filed Mar. 16, 2016, each of which is assigned to the assignee hereof, and each of which is expressly incorporated by reference in its entirety herein.

BACKGROUND

The following relates generally to memory devices and more specifically to cell-specific reference generation and sensing.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, the electronic device may read, or sense, the stored state in the memory device. To store information, the electronic device may write, or program, the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory, e.g., flash memory, can store data for extended periods of time even in the absence of an external power source. Volatile memory devices, e.g., DRAM, may lose their stored state over time unless they are periodically refreshed by an external power source. A binary memory device may, for example, include a charged or discharged capacitor. A charged capacitor may become discharged over time through leakage currents, resulting in the loss of the stored information. Certain aspects of volatile memory may offer performance advantages, such as faster read or write speeds, while aspects of non-volatile, such as the ability to store data without periodic refreshing, may be advantageous.

FeRAM may use similar device architectures as volatile memory but may have non-volatile properties due to the use of a ferroelectric capacitor as a storage device. FeRAM devices may thus have improved performance compared to other non-volatile and volatile memory devices. A device using FeRAM may use a reference voltage to sense the logic state stored by an FeRAM memory cell. But the reference voltage may not be tuned to that specific memory cell. Attempting to read a memory cell using a reference voltage that is not specific to the memory cell may result in inaccurate reads and decreased performance across an array.

BRIEF DESCRIPTION OF THE DRAWINGS

The disclosure herein refers to and includes the following figures.

DETAILED DESCRIPTION

Figure 1:
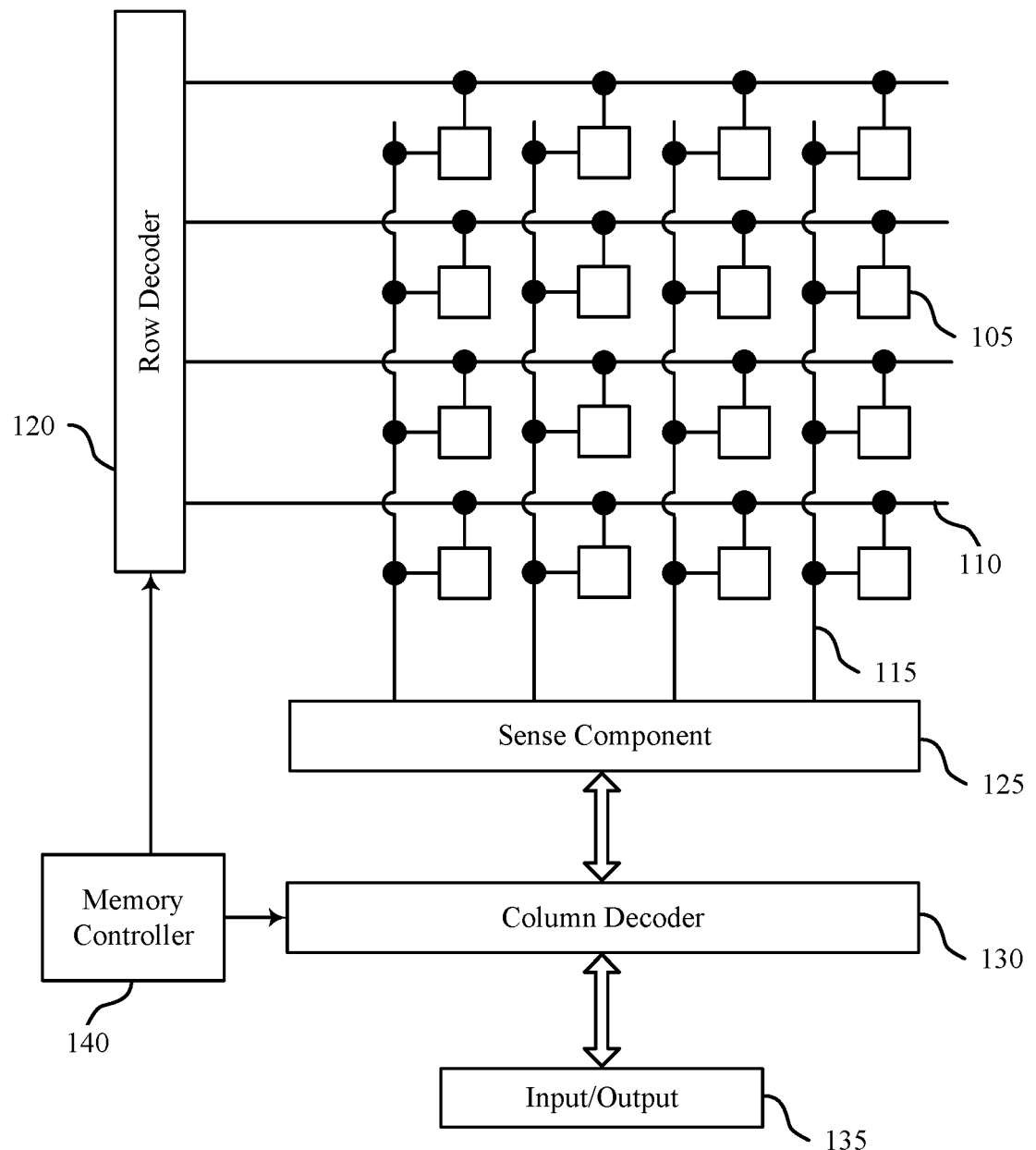
FIG. 1 illustrates an example memory array that supports cell-specific reference generation and sensing in accordance with various embodiments of the present disclosure.

A cell-specific reference voltage may be created for a memory cell of a memory array by, for example, performing multiple read operations of the memory cell before determining the logic state stored in the memory cell. For example, a first read operation may store a portion of charge of an active memory cell on a digit line of an inactive memory cell. The memory cell may then be at least partially re-charged (e.g., rewritten). A subsequent second read operation may create a cell-specific reference voltage at the digit line of the active memory cell by discharging the active memory cell to the digit line of the active memory cell. This reference voltage may be compared to the voltage on the digit line of the inactive memory cell to determine the original state of the active memory cell.

As described in further detail below, memory cells, including ferroelectric memory cells, within a memory array may be accessed by a word line and a digit line. Access includes writing to a cell (e.g., storing a logic state) or reading a cell (e.g., sensing a stored logic state). Each cell may have a ferroelectric capacitor, or other storage component, that is used to store a logic value of the cell. For example, each cell may store either a logic 0 or a logic 1. Each stored logic value may correspond to a respective state of the cell and may produce a signal on a digit line of the cell. For example, a stored logic 1 may correspond to a first digit line voltage and a stored logic 0 may correspond to a second digit line voltage. The digit line may connect multiple memory cells and may be connected to a sense amplifier that, when activated during a read operation, is used to determine the stored logic state of a memory cell. For example, an activated sense amplifier may compare the signal (e.g., voltage) extracted from the cell to a reference signal.

The reference signal may be a voltage that has a value halfway (or nearly halfway) between the respective digit line voltages for a logic 0 and a logic 1. But the digit line voltages for each cell state (e.g., stored logic 1 or logic 0) may vary from cell to cell of an array. So there may be a discrepancy between a common voltage reference used for an array of cells and a more accurate reference voltage for a particular cell within the array. Additionally, the reference voltage for an array may fluctuate over time due to variations in cell use and cell characteristics. Thus, each cell in the array may use a sensing scheme to dynamically create a reference voltage that is specific to that cell.

As described herein, an active cell storing a state may be discharged onto a digit line of the cell. This digit line may be connected to the digit line of an inactive cell so that charge-sharing occurs, and a portion of the charge discharged by the active cell may be transferred to and stored on the digit line of the inactive cell (e.g., using the intrinsic capacitance of the digit line); the portion of charge may also be used to write an intermediary state to the active cell. When the active cell is discharged on the digit line again, the resulting voltage may be used as a reference voltage in a comparison with the voltage stored on the digit line of the inactive cell. The original state of the active cell may be sensed based on this comparison.

Embodiments of the disclosure introduced above are further described below in the context of a memory array. Specific examples are then described for cell-specific reference generation and sensing. These and other embodiments of the disclosure are further illustrated by and described with reference to apparatus diagrams, system diagrams, and flowcharts that relate to cell-specific reference generation and sensing.

FIG. 1 illustrates an example memory array 100 that supports cell-specific reference generation and sensing in accordance with various embodiments of the present disclosure. Memory array 100 may also be referred to as an electronic memory apparatus. Memory array 100 includes memory cells 105 that are programmable to store different states. Each memory cell 105 may be programmable to store two states, denoted as a logic 0 and a logic 1. In some cases, a memory cell 105 is configured to store more than two logic states. For instance, a memory cell 105 may store intermediary states that correspond to states in between a logic 0 and a logic 1. A memory cell 105 may include a capacitor to store a charge representative of a programmable state; for example, a charged and uncharged capacitor may represent two logic states. A capacitor that is in between a fully charged state and an uncharged state may represent an intermediary state. In DRAM architectures, the capacitor employed may include a dielectric material with linear electric polarization properties. By contrast, a ferroelectric memory cell may include a capacitor that has a ferroelectric as the dielectric material. Different levels of charge of a ferroelectric capacitor may represent different logic states. Ferroelectric materials have non-linear polarization properties, and some details and advantages of a ferroelectric memory cell 105 are discussed below.

Operations such as reading and writing may be performed on memory cells 105 by activating or selecting the appropriate word line 110 and digit line 115. A word line 110 may also be referred to as an access line 110. Activating or selecting a word line 110 or a digit line 115 may include applying a voltage (e.g., a positive voltage or a negative voltage) to the respective line. In some cases, a digit line 115 may be referred to as a bit line. Word lines 110 and digit lines 115 may be made of conductive materials. In some examples, word lines 110 and digit lines 115 are made of metals (e.g., copper, aluminum, gold, tungsten, etc.). According to the example of FIG. 1, each row of memory cells 105 is connected to a single word line 110, and each column of memory cells 105 is connected to a single digit line 115. By activating one word line 110 and one digit line 115, a single memory cell 105 may be accessed at their intersection. The intersection of a word line 110 and digit line 115 may be referred to as an address of a memory cell.

In some architectures, the logic storing device of a memory cell 105, e.g., a capacitor, may be electrically isolated from the digit line by a selection device. The word line 110 may be connected to and may control the selection device. For example, the selection device may be a transistor and the word line 110 may be connected to the gate of the transistor. Activating the word line 110 results in a closed circuit electrical connection between the capacitor of a memory cell 105 and its corresponding digit line 115. The digit line may then be accessed to either read or write the memory cell 105.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate digit line 115. Thus, by activating a word line 110 and a digit line 115, a memory cell 105 may be accessed.

Upon accessing, a memory cell 105 may be read, or sensed, by sense component 125. For example, sense component 125 may compare a signal (e.g., a voltage) of the relevant digit line 115 to a reference signal (not shown) in order to determine the stored state of the memory cell 105. If digit line 115 has a higher voltage than the reference voltage, then sense component 125 may determine that the stored state in memory cell 105 was a logic 1 and vice versa. As described herein, a voltage used for reference may be cell-specific, and may be created using a multi-step read operation in which a charge of a memory cell 105 is initially stored on a digit line 115 of an inactive memory cell 105 and subsequently compared to a charge stored on a digit line 115 of an active memory cell 105. With respect to a memory cell 105 that includes a ferroelectric capacitor, reading the memory cell may include biasing—e.g., applying a voltage to—a plate of the ferroelectric capacitor.

Sense component 125 may include various transistors or amplifiers in order to detect and amplify a difference in the signals, which may be referred to as latching. The detected logic state of memory cell 105 may then be output through column decoder 130 as output 135. In some cases, the signal that results on the digit line 115 from accessing a memory cell 105 may be stored elsewhere in the memory array 100 (e.g., on the digit line of another memory cell 105) before being compared by sense component 125. This signal may represent the state of the original memory cell 105 or serve as a reference voltage.

A memory cell 105 may be set, or written, by activating the relevant word line 110 and digit line 115. As discussed above, activating a word line 110 electrically connects the corresponding row of memory cells 105 to their respective digit lines 115. By controlling the relevant digit line 115 while the word line 110 is activated, a memory cell 105 may be written—i.e., a logic value may be stored in the memory cell 105. Column decoder 130 may accept data, for example input 135, to be written to the memory cells 105. In the case of a ferroelectric capacitor, a memory cell 105 is written by applying a voltage across the ferroelectric capacitor. This process is discussed in more detail below.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high—e.g., tens of refresh operations per second may be employed for DRAM—which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. Ferroelectric memory cells may, however, have beneficial properties that may result in improved performance relative to other memory architectures. For example, because ferroelectric memory cells tend to be less susceptible to degradation of stored charge, a memory array 100 that employs ferroelectric memory cells 105 may require fewer or no refresh operations, and may thus require less power to operate. Additionally, as described herein, ferroelectric memory cells may use cell-specific reference voltages that improve read accuracy.

The memory controller 140 may control the operation (e.g., read, write, re-write, refresh, etc.) of memory cells 105 through the various components, for example, row decoder 120, column decoder 130, and sense component 125. Memory controller 140 may generate row and column address signals in order to activate the desired word line 110 and digit line 115. Memory controller 140 may also generate and control various voltages used during the operation of memory array 100. In general, the amplitude, shape, or duration of an applied voltage discussed herein may be adjusted or varied and may be different for the various operations for operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

Figure 2:
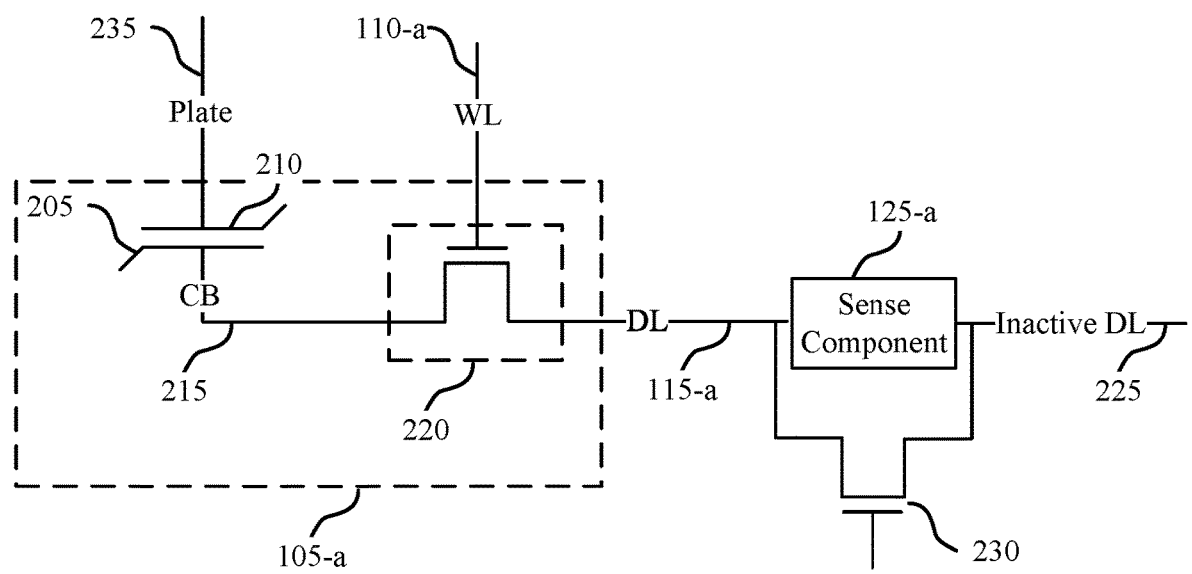
FIG. 2 illustrates an example circuit of a memory cell that supports cell-specific reference generation and sensing in accordance with various embodiments of the present disclosure.

FIG. 2 illustrates an example circuit 200 that supports cell-specific reference generation and sensing in accordance with various embodiments of the present disclosure. Circuit 200 includes a ferroelectric memory cell 105-a, word line (or access line) 110-a, digit line 115-a, and sense component 125-a, which may be examples of a memory cell 105, word line 110, digit line 115, and sense component 125, respectively, as described with reference to FIG. 1. Circuit 200 may also include inactive digit line 225 and switching component 230. Inactive digit line 225 may be the digit line of an inactive memory cell (not shown) which has a deactivated word line. Memory cell 105-a may include a logic storage component, such as capacitor 205, which has a first plate and a second plate that are capacitively coupled. The first plate may be referred to as cell plate 210 and the second plate may be referred to as cell bottom 215. Cell plate 210 may be accessed via plate line 235 and cell bottom 215 may be accessed via digit line 115-a. In the example of FIG. 2, the terminals of capacitor 205 are separated by an insulating ferroelectric material. As described above, various states may be stored by charging or discharging capacitor 205, i.e., polarizing the ferroelectric material of capacitor 205. The total charge need to polarize capacitor 205 may be referred to as the remnant polarization (PR) value, and a voltage of capacitor 205 at which half the total charge of capacitor 205 is reached may be referred to as the coercive voltage (VC).

The stored state of capacitor 205 may be read or sensed by operating various elements represented in circuit 200. Capacitor 205 may be in electronic communication with digit line 115-a. Capacitor 205 may thus be isolated from the digit line 115-a when selection component 220 is deactivated, and capacitor 205 may be connected to digit line 115-a via selection component 220 when selection component 220 is activated to select the ferroelectric memory cell 105-a. In other words, ferroelectric memory cell 105-a may be selected using selection component 220 that is in electronic communication with ferroelectric capacitor 205, where ferroelectric memory cell 105-a includes selection component 220 and ferroelectric capacitor 205. In some cases, selection component 220 may be a transistor and its operation may be controlled by applying a voltage to the transistor gate, where the voltage magnitude is such that the threshold voltage magnitude of the transistor is overcome. Word line 110-a may activate selection component 220; for example, a voltage applied to word line 110-a may be applied to the transistor gate, connecting capacitor 205 with digit line 115-a. In an alternative embodiment the positions of selection component 220 and capacitor 205 may be switched so that selection component 220 is between plate line 235 and cell plate 210 and so that capacitor 205 is between digit line 115-a and the other terminal of selection component 220. In this embodiment, selection component 220 may remain in electronic communication digit line 115-a through capacitor 205. This configuration may be associated with alternative timing.

In the example depicted in FIG. 2, capacitor 205 is a ferroelectric capacitor. Due to the ferroelectric material between the plates of capacitor 205, and as discussed in more detail below, capacitor 205 may not discharge upon connection to digit line 115-a. Instead, plate 210 may be biased by an external voltage, resulting in a change in the stored charge on capacitor 205. The change in stored charge depends on the initial state of capacitor 205, i.e., whether the initial state stored a logic 1 or a logic 0. The change in stored charge may then be compared to a reference (e.g., a cell-specific reference voltage) by sense component 125-a in order to determine the stored logic state in memory cell 105-a. The reference voltage may be specific to memory cell 105-a and may generated using memory cell 105-a.

The specific sensing scheme or process may take many forms. In one example, digit line 115-a may have an intrinsic capacitance and develop a non-zero voltage as capacitor 205 charges or discharges in response to the voltage applied to plate 210. Inactive digit line 225 may also have an intrinsic capacitance. In some cases, inactive digit line 225 may be connected to digit line 115-a so that the charge on digit line 115-a may transfer to inactive digit line 225. For example, digit line 115-a may be shorted to inactive digit line 225 by activating switching component 230. Digit line 115-a may be isolated from inactive digit line 225 by deactivating switching component 230. Isolation of digit line 115-a from inactive digit line 225 may occur prior to activation of sense component 125-a.

The intrinsic capacitance of a digit line 115 may depend on physical characteristics, including the dimensions, of the digit line 115. Digit line 115-a may connect many memory cells 105 so digit line 115-a may have a length that results in a non-negligible capacitance (e.g., on the order of pF). The subsequent voltage of digit line 115-a may depend on the initial logic state of capacitor 205, and sense component 125-a may compare this voltage to a reference voltage (e.g., a cell-specific reference voltage). For example, a voltage may be applied to plate 210 and a voltage at capacitor bottom 215 may change in relation to the stored charge. The voltage at capacitor bottom 215 may be compared with a reference voltage at sense component 125-a, and a comparison to the reference voltage may indicate a change in the charge of capacitor 205 resulting from the applied voltage and thus indicate a logic state stored in memory cell 105-a. The relationship between charge and voltage in capacitor 205 is described in further detail with reference to FIG. 3.

To write memory cell 105-a, a voltage may be applied across capacitor 205. Various methods may be used. In one example, selection component 220 may be activated through word line 110-a in order to electrically connect capacitor 205 to digit line 115-a. A voltage may be applied across capacitor 205 by controlling the voltage of plate 210 using plate line 235 and controlling the voltage of cell bottom 215 using digit line 115-a. To write a logic 1, plate 210 may be taken high, that is, a positive voltage may be applied, and cell bottom 215 may be taken low, i.e., connected to ground, virtually grounded, or a negative voltage may be applied to plate 210. The opposite process is performed to write a logic 0, i.e., the voltage of plate 210 may be taken low and the voltage of cell bottom 215 may be taken high. In some cases, an insufficient or limited voltage applied across the capacitor 205 may result in an intermediary state being stored (e.g., a state in between a logic 1 and a logic 0). When memory cell 105-a is read, the charge corresponding to the intermediary state may accumulate on digit line 115-a, resulting in a voltage that can be used as a reference voltage by sense component 125-a.

The reference voltage may be created by performing two read operations prior to activating sense component 125-a. For example, a first charge associated with a logic state of capacitor 205 may be discharged onto active digit line 115-a (e.g., during a first read operation). A portion of the first charge may be captured on inactive digit line 225 by activating switching component 230, which allows active digit line 115-a to charge-share with inactive digit line 225. The resulting charge on digit line 115-a (e.g., the portion of the first charge resulting from charge sharing with inactive digit line 225) may be used to write an intermediary state back to capacitor 205 (e.g., capacitor may store a second charge). The second charge may be transferred to digit line 115-a (e.g., by activating selection component 220). The portion of the first charge captured on inactive digit line 225 may result in a first voltage and the second charge on active 115-a may result in a second voltage. The second voltage (i.e., the voltage on digit line 115-a) may be used as a reference voltage by sense component 125-a in a comparison with the first voltage (i.e., the voltage on inactive digit line 225) to determine the logic state of capacitor 205. Thus, a cell-specific reference voltage may be generated and used in a sense operation of memory cell 105-a.

Figure 3:
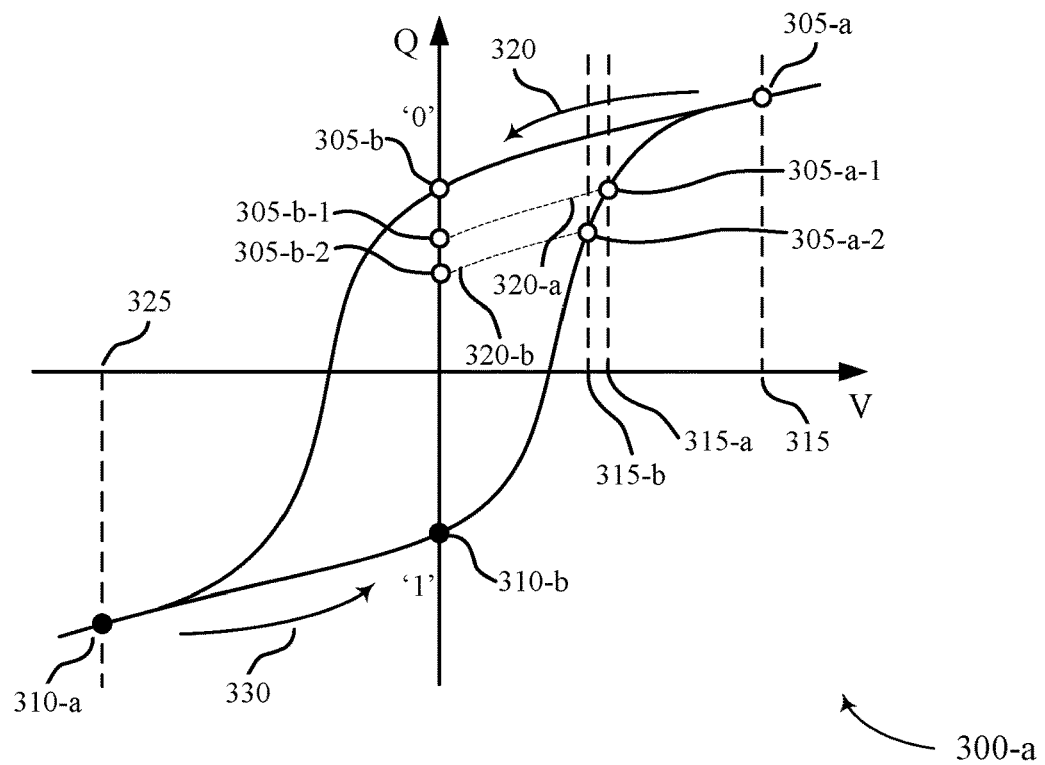
FIG. 3 illustrates example hysteresis plots for operating a ferroelectric memory cell that supports cell-specific reference generation and sensing in accordance with various embodiments of the present disclosure.
Figure 3:
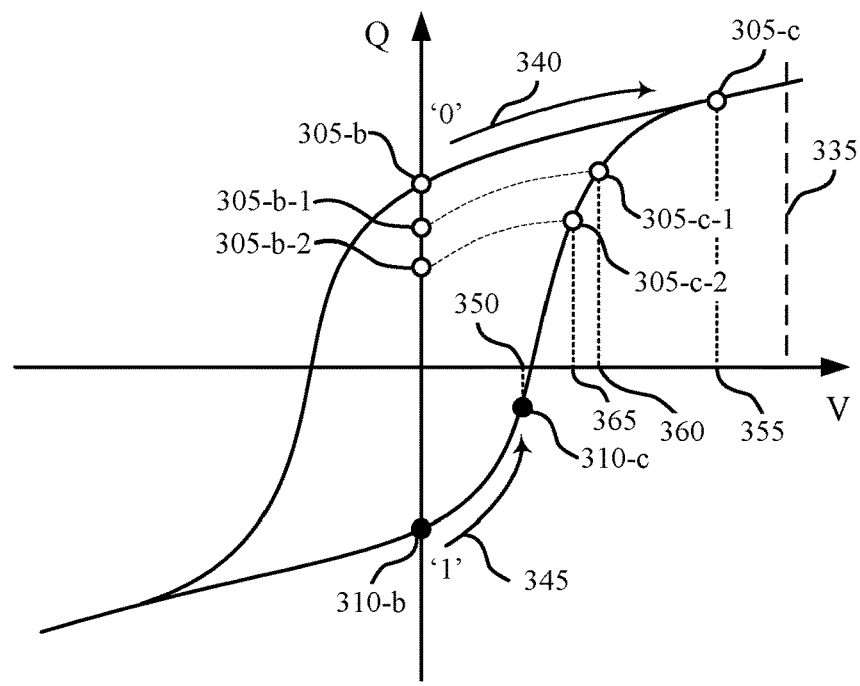

Read and write operations of capacitor 205 may account for the non-linear properties associated with a ferroelectric device. FIG. 3 illustrates examples of such non-linear properties with hysteresis curves 300 for a ferroelectric memory cell that supports cell-specific reference generation and sensing in accordance with various embodiments of the present disclosure. Hysteresis curves 300-a and 300-b illustrate an example ferroelectric memory cell writing and reading process, respectively. Hysteresis curves 300 depict the charge, Q, stored on a ferroelectric capacitor (e.g., capacitors 205 of FIG. 2) as a function of a voltage, V.

A ferroelectric material is characterized by a spontaneous electric polarization, i.e., it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300 may be understood from the perspective of a single terminal of a capacitor. By way of example, if the ferroelectric material has a negative polarization, positive charge will accumulate at the terminal. Likewise, if the ferroelectric material has a positive polarization, negative charge will accumulate at the terminal. Additionally, it should be understood that the voltages in hysteresis curves 300 represent a voltage difference across the capacitor and are directional. For example, a positive voltage may be applied by applying a positive voltage to the terminal in question and maintaining the second terminal at ground. A negative voltage may be applied by maintaining the terminal in question at ground and applying a positive voltage to the second terminal, i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300.

As depicted in hysteresis curve 300-a, the ferroelectric material may maintain a positive or negative polarization with a zero voltage difference, resulting in two possible charged states: charge state 305-b and charge state 310-b. According to the example of FIG. 3, charge state 305-b represents a logic 0 and charge state 310-b represents a logic 1. In some examples, the logic values of the respective charge states may be reversed to accommodate other schemes for operating a memory cell. In some cases, a capacitor may store an intermediary charge state (e.g., intermediary charge state 305-b-1 or intermediary charge state 305-b-2). An intermediary charge state may be a charge state that is between the charge state corresponding to a logic 0 (e.g., 305-b) and the charge state corresponding to a logic 1 (e.g., 310-b). As described herein, an intermediary charge state may be used to create or generate a reference voltage.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-*a* is reached. Upon removing voltage 315, charge state 305-*a* follows path 320 until it reaches charge state 305-*b* at zero volts. Similarly, charge state 310 is written by applying a net negative voltage 325, which results in charge state 310-*a*. After removing negative voltage 325, charge state 310-*a* follows path 330 until it reaches charge state 310-*b* at zero voltage.

If a different positive voltage 315 is applied across the capacitor, a different charge state 305 may result. For example, when positive voltage 315-*a* is applied across the capacitor, charge state 305-*a*-1 may result. Upon removal of positive voltage 315-*a*, charge state 305-*a*-1 may follow path 320-*a* until it reaches intermediary charge state 305-*b*-1 at zero volts. This charge state may be an intermediate charge state between a logic 1 and a logic 0 and may correspond to a "weak" logic 0. Thus, a "weak" logic 0 may be represented by an intermediary charge state 305-*b*-1 that is between the charge state 305-*b* of a normal logic 0 and zero charge.

In another example, when positive voltage 315-*b* is applied across the capacitor, charge state 305-*a*-2 may result. Upon removal of positive voltage 315-*b*, charge state 305-*a*-2 may follow path 320-*b* until it reaches intermediary charge state 305-*b*-2 at zero volts. This charge state may be an intermediate charge state between a logic 1 and a logic 0 and may correspond to a "very weak" logic 0. Thus, a "very weak" logic 0 may be represented by an intermediary charge state 305-*b*-2 that is between the charge state of a "weak" logic 0 (e.g., intermediary charge state 305-*b*-1) and zero charge. Thus, intermediary states may be stored by applying different net positive voltages 315 across the capacitor. The terms "weak" and "very weak" are exemplary terms of degree. Other terms may be used to assign value to the intermediary charge states described above.

To read, or sense, the stored state of the ferroelectric capacitor, a voltage may be applied across the capacitor. In response, the stored charge changes, and the degree of the change depends on the initial charge state—i.e., the degree to which the stored charge of the capacitor changes varies depending on whether charge state 305-*b* or 310-*b* was initially stored. For example, hysteresis curve 300-*b* illustrates two possible stored charge states 305-*b* and 310-*b*. Net voltage 335 may be applied to the plate (e.g., plate 210 with reference to FIG. 2) of the capacitor. Although depicted as a positive voltage, voltage 335 may be negative. In response to voltage 335, charge state 305-*b* may follow path 340. Likewise, if charge state 310-*b* was initially stored, then it follows path 345. The final position of charge state 305-*c* and charge state 310-*c* depend on a number of factors, including the specific sensing operation and circuitry.

As described herein, intermediary states between a logic 1 and a logic 0 may be stored at a capacitor. For example, stored intermediary charge state 305-*b*-1 may correspond to a "weak" logic 0 and stored intermediary charge state 305-*b*-2 may correspond to a "very weak" logic 0. When voltage 335 is applied across the capacitor, intermediary charge state 305-*b*-1 may follow a path to a final charge state 305-*c*-1 and intermediary charge state 305-*b*-2 may follow a path to final charge state 305-*c*-2. The voltage 360 associated with charge state 305-*b*-1 (which corresponds to a "weak" logic 0) may be less than the voltage 355 associated with charge state 305-*c* (which corresponds to a logic 0) and greater than the voltage 350 associated with charge state 310-*c* (which corresponds to a logic 1). The voltage 365 associated with charge state 305-*c*-2 (which corresponds to a "very weak" logic 0) may be less than the voltage 360 (which corresponds to a "weak" logic 0) and greater than the voltage 350 associated with charge state 310-*c* (which corresponds to a logic 1). As described herein, the voltage 360 and the voltage 365 may be used as reference voltages for a sense operation of the memory cell.

In some cases, the final charge may depend on the intrinsic capacitance of the digit line of a memory cell. For example, if the capacitor is electrically connected to the digit line and voltage 335 is applied, the voltage of the digit line may rise due to its intrinsic capacitance and the voltage measured at a sense component may depend on the resulting voltage of the digit line. The position of final charge states 305-*c*, 305-*c*-1, 305-*c*-2, and 310-*c* on hysteresis curve 300-*b* may thus depend on the capacitance of the digit line and may be determined through a load-line analysis, i.e., charge states 305-*c*, 305-*c*-1, 305-*c*-2, and 310-*c* may be defined with respect to the digit line capacitance. As a result, the voltage of the capacitor, voltage 350, voltage 355, voltage 360, and/or voltage 365 may be different and may depend on the initial state of the capacitor.

The initial state of the capacitor may be determined by using a reference voltage created or generated from the voltage of the capacitor (e.g., resulting from voltage 360 or voltage 365). For example, the reference voltage may be the voltage applied to the plate of the capacitor minus voltage 360 or voltage 365. The reference voltage may be used in a comparison with a stored version of voltage 350 or voltage 355 to determine a logic state of the memory cell. The stored version of voltage 350 (or 355) may be a reduced version of the voltage that occurs when the voltage 350 (or 355) is subtracted from the applied voltage 335. Upon comparison, the sensed voltage (e.g., the reduced version of voltage 350 or voltage 355) may be determined to be higher or lower than the reference voltage. A value of the ferroelectric cell (i.e., a logic 0 or 1) may then be determined based on the comparison. As described herein, the reference voltage may be specific to the capacitor so that changes in the voltages associated with logic 1s and 0s are compensated for by the reference voltage.

As discussed above, reading a memory cell that does not use a ferroelectric capacitor may degrade or destroy the stored logic state. A ferroelectric memory cell, however, may maintain the initial logic state after a read operation. For example, if charge state 305-*b* is stored and the read operation performed, the charge state may follow path 340 to charge state 305-*c*, and after removing voltage 335, the charge state may return to initial charge state 305-*b*, for example, by following path 340 in the opposite direction.

Figure 4:
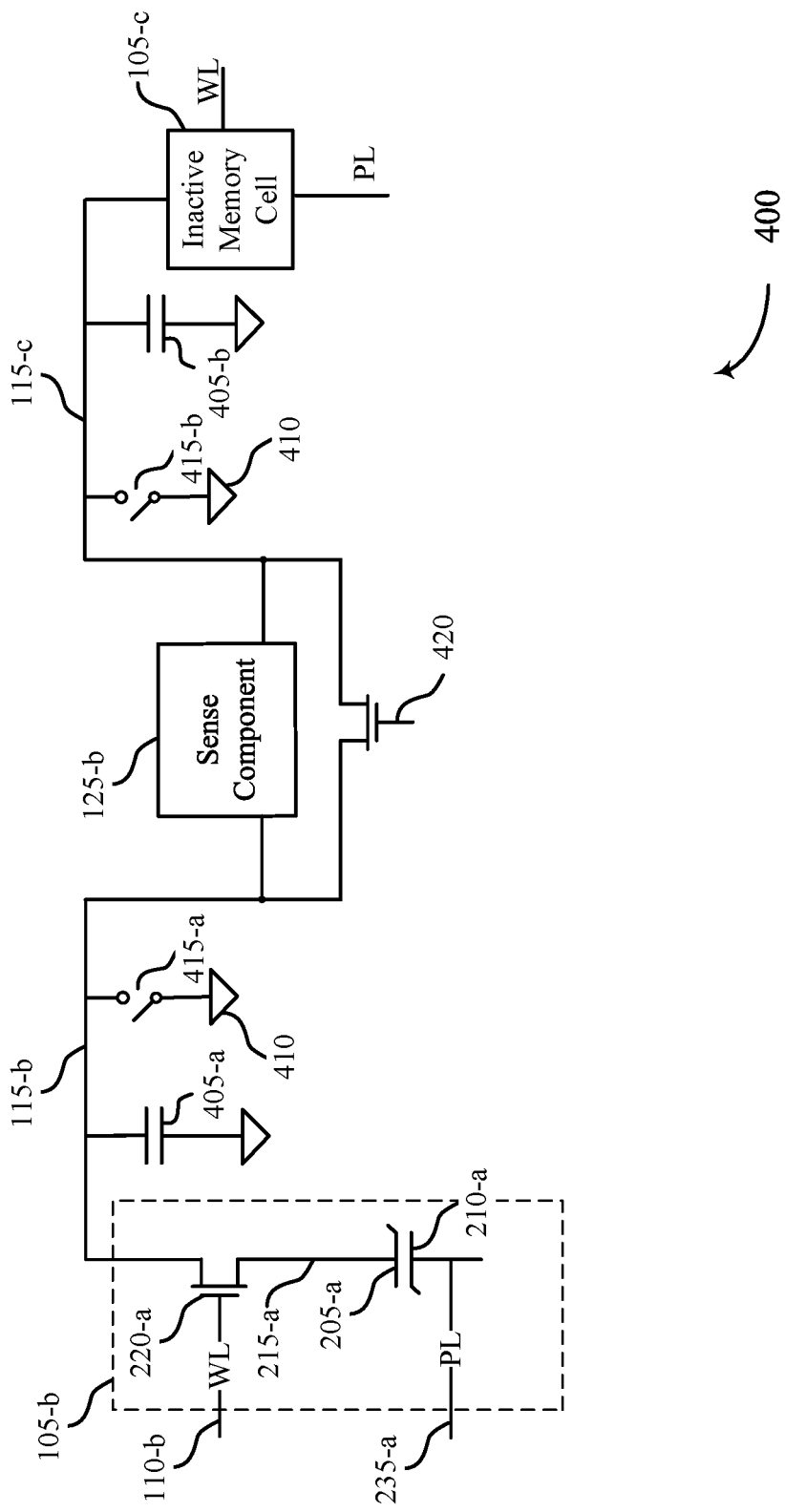
FIG. 4 illustrates an example circuit that supports cell-specific reference generation and sensing in accordance with various embodiments of the present disclosure.

FIG. 4 illustrates an example circuit 400 that supports cell-specific reference generation and sensing in accordance with various embodiments of the present disclosure. Circuit 400 may be operated so that a cell-specific reference voltage is generated and used in a comparison to determine a logic state of a memory cell. For example, the reference voltage may be used by sense component 125-*b* to determine a stored state of active memory cell 105-*b*. Circuit 400 may include an active memory cell 105-*b* and an inactive memory cell 105-*c*, which may be examples of a memory cell 105 described with reference to FIGS. 1 and 2. A memory cell 105 may be inactive if its corresponding word line is not activated (e.g. the selection component is off). Active memory cell 105-*b* may include selection component 220-*a* and capacitor 205-*a* (e.g., a ferroelectric capacitor). Capacitor 205-*a* may include plate 210-*a*, which is accessed using plate line 235-*a*, and cell bottom 215-*a*, which is accessed using word line 110-*b*. Inactive memory cell 105-*c* may include a ferroelectric capacitor and selection component (not shown). Inactive memory cell 105-*c* may also be referred to as a reference memory cell. Memory cell 105-*b* may be selected using selection component 220-*a* by applying a voltage to word line 110-*b* (which may also be referred to as access line 110-*b*). The voltage applied to word line 110-*b* may be a positive voltage, as described herein, or a negative voltage.

According to the example depicted in FIG. 4, digit line 115-*b* includes intrinsic digit line capacitance that may be modeled as a parallel-plate capacitor 405-*a* between digit line 115-*b* and ground 410. Digit line 115-*b* is capable of being connected to ground 410 via switching component 415-*a*. Similarly, digit line 115-*c* includes intrinsic digit line capacitance that is modeled as capacitor 405-*b*. Digit line 115-*c* is capable of being connected to ground 410 via switching component 415-*b*. The intrinsic digit line capacitance may depend on the physical characteristics, including the dimensions, of digit line 115-*b* and inactive digit line 115-*c*. The switching components 415 may be implemented using switching components known in the art (e.g., transistors). For example, switching component 415 may be a transistor connected in series with switching component 420 and digit line 115-*b*. In some cases, the transistor comprises a p-type FET. Although shown external to sense component 125-*b*, in some examples the switching components 415 may be internal to sense component 125-*b*.

Circuit 400 also includes switching component 420, which may be an example of a switching component 230 described with reference to FIG. 2. In some cases, switching component 420 may be included in sense component 125-*b*. When activated, switching component 420 may connect (e.g., short) digit line 115-*b* to digit line 115-*c* and enable charge-sharing between the two digit lines 115. When charge-sharing occurs, electrons may flow between the two digit lines 115 until an equilibrium voltage is reached. If inactive memory cell 105-*c* is disabled when switching component 420 is activated, all or nearly all of the charge transferred to digit line 115-*c* may be stored in capacitor 405-*b*. The charge transferred to digit line 115-*c* may be a portion of charge that is stored by capacitor 205-*a* due to charge-sharing with digit line 115-*b*. Thus, a charge corresponding to a particular logic state on digit line 115-*b* may be effectively captured by and give rise to a voltage on capacitor 405-*b*.

Selection component 220-*a* may be activated by applying a voltage to word line 110-*b*. The voltage used to activate selection component 220-*a* may be a positive voltage or a negative voltage. When selection component 220-*a* is activated, the voltage at cell bottom 215-*a* may be seen at the digit line 115-*b*. This voltage may be the voltage applied at plate 210-*a* minus the voltage across capacitor 205-*a*. As described above, the charge stored in and the voltage across a capacitor 205 may correspond to a logic 1 or a logic 0. Thus, the voltage seen at digit line 115-*b* when voltage is applied to the plate 210-*a* and word line 110-*b* may represent a logic 0 or a logic 1. When switching component 420 is activated, digit line 115-*b* may be connected to digit line 115-*c* so charge transfers from digit line 115-*b* to digit line 115-*c* (e.g., due to charge-sharing between the two digit lines 115). The charge transferred from digit line 115-*b* to digit line 115-*c* may be a portion of the charge stored by capacitor 210-*a*. The transfer of charge may result in a voltage on digit line 115-*c*. Thus, some or all of the signal (e.g., charge) transferred to digit line 115-*b* may be stored in capacitor 405-*b*. Storing the signal of a memory cell 105 for future use may be referred to as capturing the charge of the memory cell 105.

When switching component 420 is activated, the capacitance of digit line 115-*b* may be increased (e.g., due to capacitor 405-*b*) and a the voltage on digit line 115-*b* may be reduced due to charge-sharing. Thus, the signal stored in capacitor 405-*b* may be lower in would be achieved in a typical write operation. However, the margin between signals corresponding to a logic 1 and a logic 0 may be substantially preserved. The signal stored across capacitor 405-*b* may serve as the active signal (or voltage) when used for a comparison by sense component 125-*b*. That is, the signal at digit line 115-*c* may represent the state (e.g., a logic 1 or a logic 0) originally stored by capacitor 205-*a*.

To create the reference voltage used for the comparison by sense component 125-*b*, switching component 420 may be disabled (or deactivated) and the reduced signal (e.g., voltage) on digit line 115-*b* may be used to write back to capacitor 205-*a*. The disablement of switching component 420 may occur after the signal on digit line 115-*b* has been transferred to digit line 115-*c*. The signal on digit line 115-*b* may be the signal on digit line 115-*c*, due to charge-sharing, and may be a portion of the signal originally stored by capacitor 205-*a*. Thus, the voltage applied across capacitor 205-*a* (e.g., the voltage at plate 210-*a* minus the voltage of digit line 115-*b*) may be less than the normal voltage used to write a logic 1. Accordingly, the state stored by capacitor 205-*a* may correspond to an intermediary state that is between a normal logic 1 and a normal logic 0. For example, a "weak" logic 0 state may be stored at capacitor 205-*a* when the original (e.g., pre-charge sharing) signal on digit line 115-*b* was a logic 0. A "very weak" logic 0 may be stored at capacitor 205-*a* when the original signal of digit line 115-*b* was a logic 1. Thus, a second charge corresponding to an intermediary state may be stored at memory cell 105-*b*.

When this newly stored state of capacitor 205-*a* is subsequently read (e.g., the charge from memory cell 105-*b* is transferred to digit line 115-*b*), the resulting signal on digit line 115-*b* may be a reduced version of a logic 1. The signal may be a voltage that results from charge that was transferred from the memory cell 105-*b* to digit line 115-*b*. This signal may be midway, or nearly midway, between a signal representing a logic 0 and a signal representing a logic 1 at digit line 115-*b*. Thus, this digit line 115-*b* signal may be used as a reference voltage by sense component 125-*b* for a comparison with the signal stored on digit line 115-*c*. The voltage at digit line 115-*c* may be used as the sensed voltage in the comparison. In some cases, the operations of FIG. 4 may be facilitated by a controller (e.g., a memory controller 140) that is in electronic communication with memory cell 105-*c*, memory cell 105-*c*, sense component 125-*b*, and switching component 415-*a*.

Figure 5:
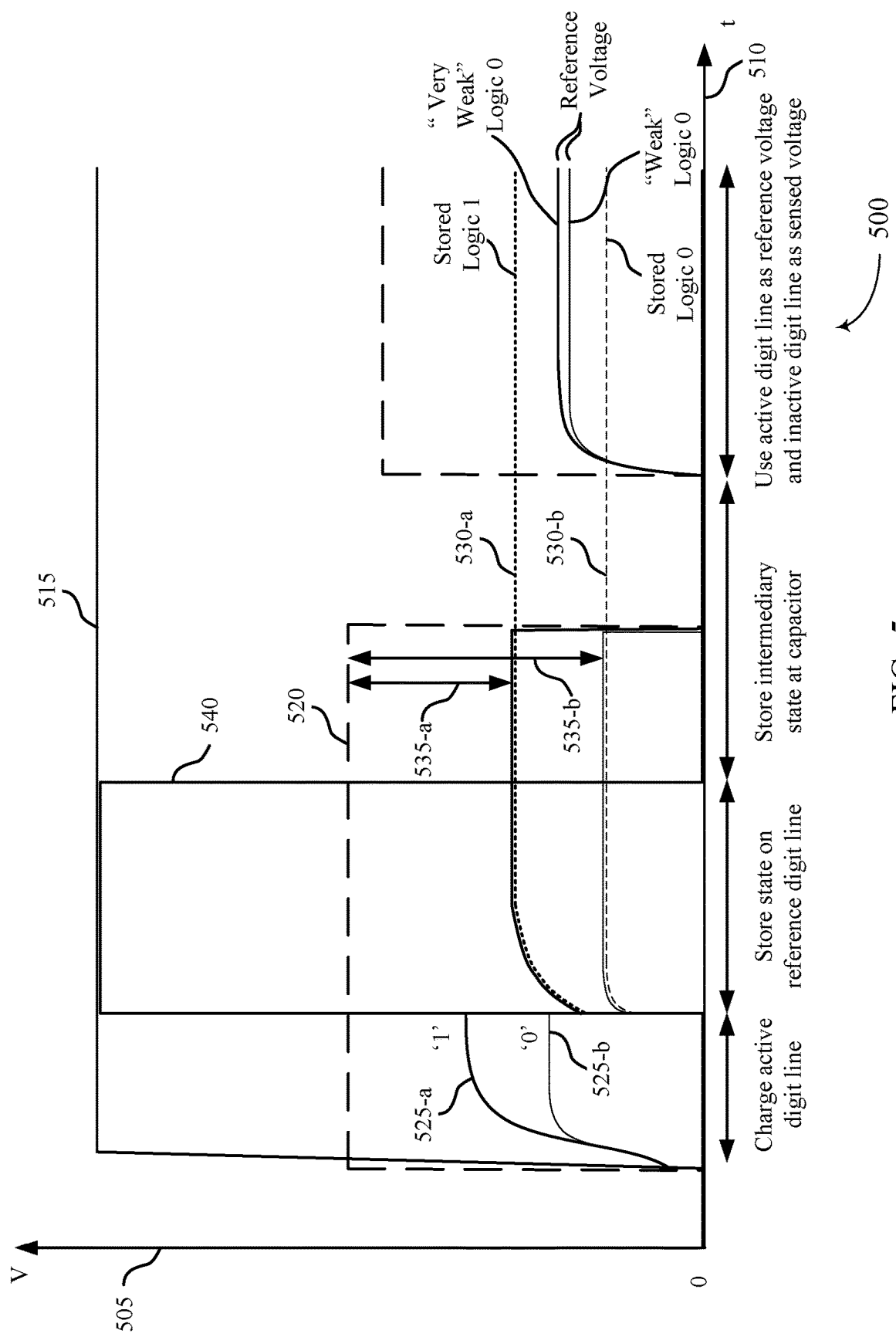
FIG. 5 illustrates an example timing diagram that supports cell-specific reference generation and sensing in accordance with various embodiments of the present disclosure.

FIG. 5 illustrates an example of a timing diagram 500 for operating a ferroelectric memory cell array that supports cell-specific reference generation and sensing in accordance with various embodiments of the present disclosure. Timing diagram 500 includes voltage on axis 505 and time on axis 510 and may represent an operation of circuit 400. The operation may create or generate a cell-specific reference voltage for circuit 400. The voltages of various components of circuit 400 are also represented as a function of time on timing diagram 500. For example, timing diagram 500 includes word line voltage 515, plate voltage 520, active digit line voltage 525-*a*, active digit line voltage 525-*b*, inactive digit line voltage 530-*a*, inactive digit line voltage 530-*b*, and switching component voltage 540. Prior to the operations of timing diagram 500, capacitor 205-*a* may be initialized so that capacitor 205-*a* stores a logic state (e.g., a logic 1 or a logic 0). Both logic states are represented in timing diagram 500—active digit line voltage 525-*a* and inactive digit line voltage 530-*a* correspond to a logic 1 stored state and active digit line voltage 525-*b* and inactive digit line voltage 530-*b* correspond to a logic 0 stored state.

Selection component 220-*a* may be activated by applying word line voltage 515 to the word line 110-*b*. Although the applied word line voltage 515 is shown as a positive voltage, in some cases the applied word line voltage 520 may be a negative voltage. When plate voltage 520 is applied to plate 210-*a*, the active digit line 115-*b* may charge to an active digit line voltage 525. An active digit line voltage 525 may be the plate voltage 520 minus the voltage across capacitor 205-*a*. Because the voltage across capacitor 205-*a* corresponds to a stored logic state, each digit line voltage 525 may correspond to a stored logic state. According to the hysteresis curves shown in FIG. 3, a logic 0 corresponds to a larger voltage across a capacitor 205 than a logic 1. So active digit line voltage 525-*a* may correspond to a logic 1 and active digit line voltage 525-*b* may correspond to a logic 0.

After active digit line 115-*b* reaches a threshold value (e.g., active digit line voltage 525-*a* or active digit line voltage 525-*b*) the switching component 420 may be activated by applying switching component voltage 540 to the gate of the switching component 420. This activation may connect active digit line 115-*b* to inactive digit line 115-*c* so that charge-sharing occurs. That is, the signal (e.g., charge) on active digit line 115-*b* may be transferred to inactive digit line 115-*c* until a threshold voltage value is reached at each digit line 115. In the example corresponding to a logic 1, active digit line 115-*b* may reach active digit line voltage 525-*a* and inactive digit line 115-*c* may reach inactive digit line voltage 530-*a*. In the example corresponding to a logic 0, active digit line 115-*b* may reach active digit line voltage 525-*b* and inactive digit line 115-*c* may reach inactive digit line voltage 530-*b*. The digit line voltage 525 resulting from the charge-sharing may be a reduced version of the voltage originally on active digit line 115-*b* (e.g., digit line voltage 525) (e.g., because the charge flowing from capacitor 405-*a* reduces the voltage on digit line 115-*b* and increases the voltage on digit line 115-*c*). However, the margin between the voltage corresponding to a logic 0 and the voltage corresponding to a logic 1 may be substantially preserved.

To capture the transferred signal at inactive digit line 115-*c*, the switching component 420 may be disabled or deactivated (e.g., by reducing the switching component voltage 540 to ground). Thus, inactive digit line 115-*c* may be used to capture, or store, the logic state originally stored at capacitor 205-*a*. Accordingly, the inactive digit line voltage 530 may serve as the sensed voltage when used by sense component 125-*b*. For instance, sense component 125-*b* may determine the original stored state of capacitor 205-*a* from inactive digit line voltage 530 by comparing inactive digit line voltage 530 to a reference voltage.

When switching component 420 is disabled, an intermediate logic state may be written to capacitor 205-*a* because the word line voltage 515 continues to maintain the active state of selection component 220-*a* and the plate voltage 520 continues to be applied to plate 210-*a*. The intermediate logic state results from the reduced signal at active digit line 115-*b*, which effectively reduces the voltage applied across capacitor 205-*a* (e.g., plate voltage 520 minus active digit line voltage 525). Thus, a net positive voltage 535-*b* may be applied across capacitor 205-*a*. The voltage 535-*b* may be less than the voltage used to write a normal logic 0. For instance, net positive voltage 535-*b* may be an example of net positive voltage 315-*a* as shown in hysteresis curve 300-*a*. And as illustrated by hysteresis curve 300-*a*, such a voltage may result in an intermediary charge state 305-*a*-1 that follows a path to intermediary charge state 305-*b*-1 when the net positive voltage 535-*b* is removed.

Removal of the net positive voltage 535 may be accomplished by reducing the plate voltage 520 and the active digit line 525 voltage to a threshold voltage (e.g., 0V). The reduction may be based at least in part on the transfer of charge that occurred between digit line 115-*b* and digit line 115-*c*. In the example depicted in FIG. 5 that corresponds to a logic 0, the digit line voltage 525-*b* is reduced by activating switching component 415-*a* so that the voltage of digit line 115-*b* is pulled to ground 410. Upon removal of the net positive voltage 535-*b*, the intermediary charge state corresponding to a "weak" logic 0 may be stored at capacitor 205-*a*.

In the example depicted in FIG. 5 that corresponds to a logic 1, a net positive voltage 535-*a* is applied across capacitor 205-*a*. The net positive voltage 535-*a* may be less than the net positive voltage 535-*a* used to write a "weak" logic 0. Thus, a "very weak" logic 0 may be written to capacitor 205-*a*. For instance, net positive voltage 535-*a* may be an example of net positive voltage 315-*b* described with reference to FIG. 3. Thus, application of net positive voltage 535-*a* may result in charge state 305-*a*-2 that follows a path to intermediary charge state 305-*b*-2 when net positive voltage 535-*a* is reduced to 0V (e.g., by dropping plate voltage 520 and grounding active digit line 115-*b*. So a state corresponding to a "very weak" logic 0 may be stored at capacitor 205-*a*.

Plate voltage 520 may be applied to memory cell 105-*b* so that charge is transferred to digit line 115-*b*. The accumulation of charge on digit line 115-*b* may result in digit line voltage 525 that reaches a threshold value associated with the state stored at capacitor 205-*a*. In the example of a logic 0, which may correspond to a stored state of a "weak" logic 0, the voltage at active digit line 115-*b* may be that of active digit line voltage 525-*b*. In the example of a logic 1, which corresponds to a stored state of a "very weak" logic 0, the voltage seen at active digit line 115-*b* may be that of active digit line voltage 525-*a*.

In some cases, the plate voltage 520 applied to capacitor 205-*a* is based at least in part on the inactive digit line voltage 530. For example, the value of plate voltage 520 may be selected so that the value of active digit line voltage 525 is substantially centered between inactive digit line voltage 530-*a* and inactive digit line voltage 530-*b*. Accordingly, active digit line voltage 525 may serve as a reference voltage for sense component 125-*a*. Because the original state of capacitor 205-*a* was stored on inactive digit line 115-*c* (e.g., across capacitor 405-*b*), inactive digit line voltage 530 may serve as the sensed voltage for sense component 125-*a*. Thus, inactive digit line voltage 530 may be compared to active digit line voltage 525 to determine the original stored state of capacitor 205-*a*.

Figure 6:
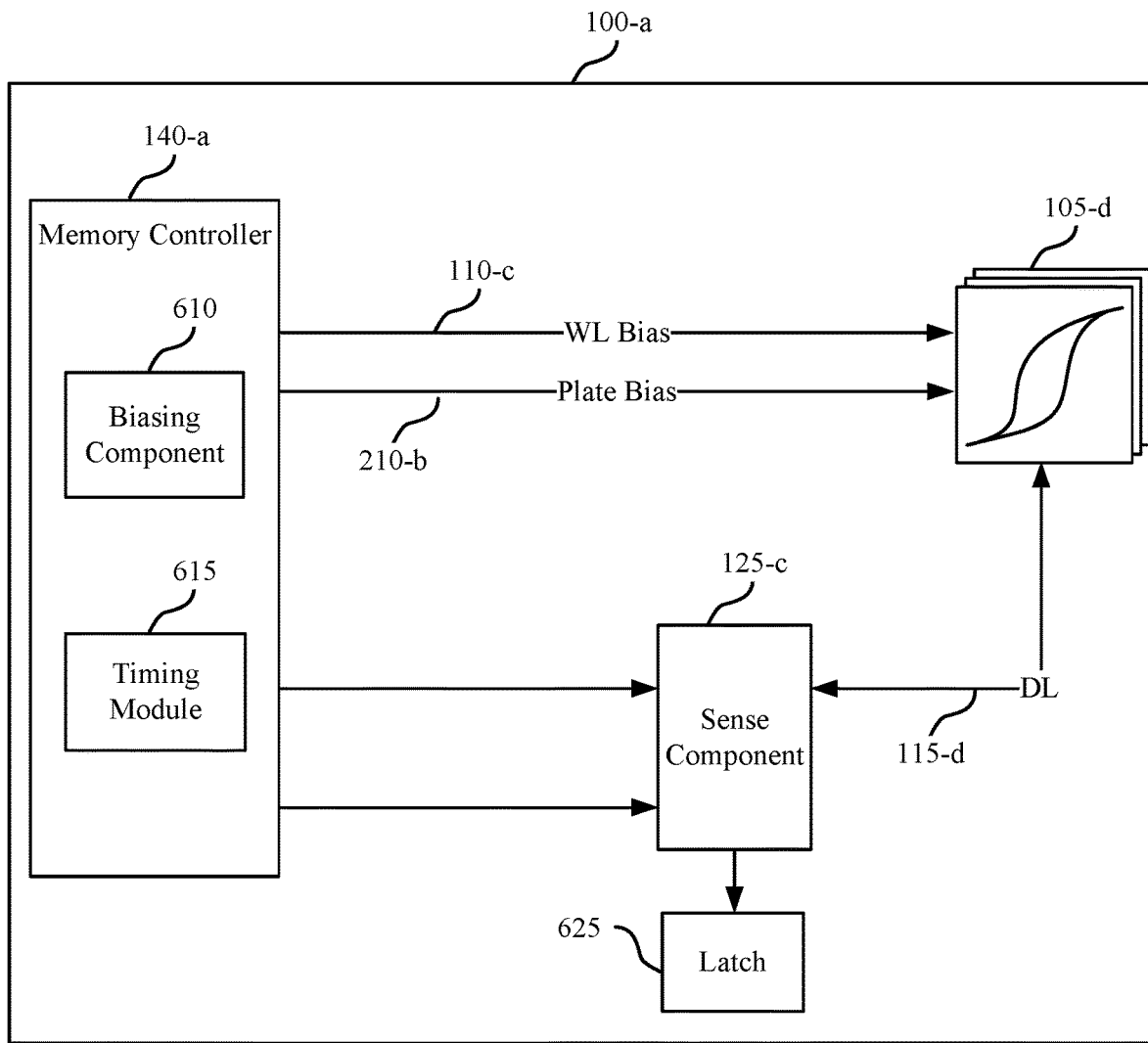
FIG. 6 illustrates a block diagram of an example ferroelectric memory array that supports cell-specific reference generation and sensing in accordance with various embodiments of the present disclosure.

FIG. 6 shows a block diagram 600 of a memory array 100-*a* that supports cell-specific reference generation and sensing in accordance with various embodiments of the present disclosure. Memory array 100-*a* may contain memory controller 140-*a* and memory cells 105-*d*, which may be examples of memory controller 140 and memory cells 105 described with reference to FIGS. 1 and 2. Memory cells 105-*d* may include active memory cells and inactive (or reference) memory cells. Memory controller 140-*a* may include biasing component 610 and timing module 615 and may operate memory array 100-*a* as described in FIGS. 1-5. Memory controller 140-*a* may be in electronic communication with word line (or access line) 110-*c*, digit line 115-*d*, sense component 125-*c*, and plate 210-*a*, which may be examples of word line 110, digit line 115, sense component 125, and plate 210 described with reference to FIG. 1 or 2. Memory array 100-*a* may also include latch 625. The components of memory array 100-*a* may be in electronic communication with each other and may perform the functions described with reference to FIGS. 1-5. In some cases, sense component 125-*c* and latch 625 may be components of memory controller 140-*a*.

Memory controller 140-*a* may be configured to activate word line 110-*c*, plate 210-*a*, or digit line 115-*d* by applying voltages (e.g., positive and negative voltages) to those various nodes. For example, biasing component 610 may be configured to apply a voltage to operate memory cell 105-*a* to read or write memory cell 105-*a* as described above. In some cases, memory controller 140-*a* may include a row decoder, column decoder, or both, as described with reference to FIG. 1. This may enable memory controller 140-*a* to access one or more memory cells 105. Biasing component 610 may provide voltage for the operation of sense component 125-*c* (e.g., biasing component 610 may activate sense component 125-*c* to trigger a comparison of two signals (e.g., a sensed voltage and a cell-specific reference voltage).

In some cases, memory controller 140-*a* may perform its operations using timing module 615. For example, timing module 615 may control the timing of the various word line selections or plate biasing, including timing for switching and voltage application to perform the memory functions, such as reading and writing, discussed herein. In some cases, timing module 615 may control the operations of biasing component 610.

In some cases, memory controller 140-*a* may facilitate (e.g., via biasing component 610 and timing module 615) the generation and usage of a cell-specific reference voltage. Memory controller 140-*a* may control the biasing of various components in 100-*a*, including components of memory cells 105-*d*. For example, memory controller 140-*a* may control the application of voltage to memory cells (e.g., via word line 110-*c*) and switching devices (not shown) to perform the operations described with respect to FIGS. 4 and 5.

Memory controller 140-*a* may facilitate the capture of a first charge from an active memory cell (e.g., by applying activation voltages to the capacitor of the memory cell and the selection component of the memory cell). The first charge may be associated with a first state (e.g., a logic 1 or a logic 0). Capturing the first charge may include storing the first charge on the digit line of an inactive memory cell (e.g., by applying an activation voltage to a switching device between the inactive and active memory cell digit lines so that the charge transfers from the active digit line to the inactive digit line). The accumulation of charge on the inactive digit line may result in a first voltage on the inactive digit line. The inactive digit line voltage may correspond to a logic 1 or a logic 0. That is, the inactive digit line voltage may be a first value that corresponds to a logic 1 or a second value that corresponds to a logic 0.

Memory controller 140-*a* may facilitate the storage of a second charge by reducing the voltage applied to the active memory cell. The applied voltage may be reduced to a threshold value (e.g., ground) and may be based on the transfer of first charge. The stored second charge may correspond to an intermediary state between a logic 1 and a logic 0 (e.g., a "weak" logic 0 or a "very weak" logic 0). In some cases, the second charge may be transferred to the active digit line by applying a voltage to the active memory cell. Accumulation of the second charge on the active digit line may result in a voltage on the active digit line. The voltage may be a function of, or based on, the voltage applied to the active memory cell and the voltage on the inactive digit line.

In some cases, the voltage applied to the memory cell may be selected based on the voltage on the inactive digit line. For example, the applied voltage may be selected (e.g., by the memory controller 140-*a*) so that when the stored second charge is discharged onto the active digit line the resulting voltage is midway between the inactive digit line voltage values corresponding to a logic 1 and a logic 0. Thus, the active digit line voltage may be used as a reference voltage (e.g., by sense component 125-*c*) to determine a logic state associated with the inactive digit line voltage. For example, sense component 125-*a* may compare the active digit line voltage (serving as the reference voltage) to the inactive digit line voltage. Upon determining the logic state, sense component 125-*c* may store the output in latch 625, where it may be used in accordance with the operations of an electronic device using the memory device of which memory array 100-*a* is a part.

Figure 7:
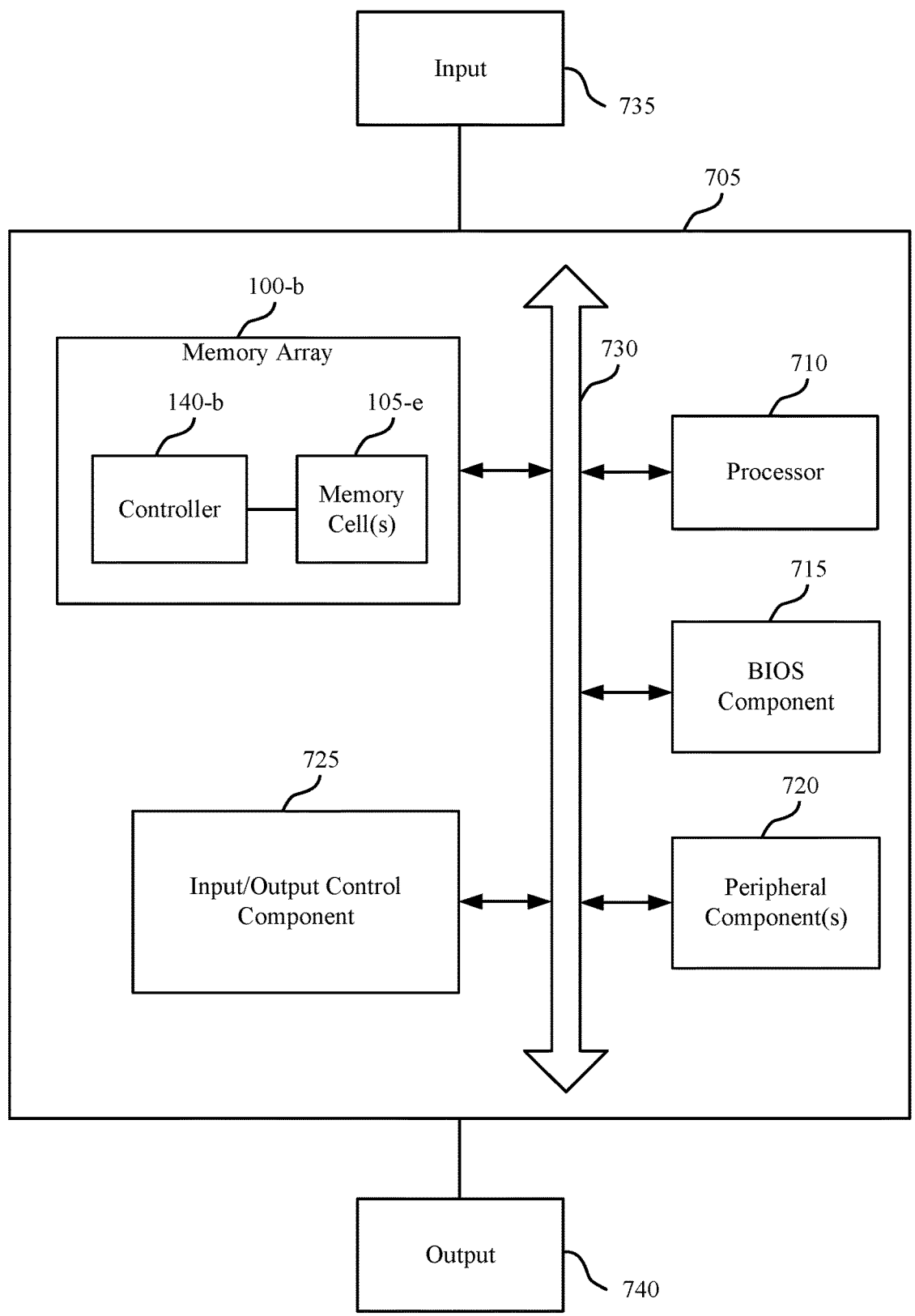
FIG. 7 illustrates a block diagram of a device, including a memory array, that supports cell-specific reference generation and sensing in accordance with various embodiments of the present disclosure.

FIG. 7 illustrates a system 700 that supports cell-specific reference generation and sensing in accordance with various embodiments of the present disclosure. System 700 includes a device 705, which may be or include a printed circuit board to connect or physically support various components. Device 705 includes a memory array 100-*b*, which may be an example of memory array 100 described with reference to FIGS. 1 and 6. Memory array 100-*b* may contain memory controller 140-*a* and memory cell(s) 105-*e*, which may be examples of memory controller 140 described with reference to FIGS. 1 and 6 and memory cells 105 described with reference to FIGS. 1, 2, 4, and 6. Device 705 may also include a processor 710, BIOS component 715, peripheral component(s) 720, and input/output control component 725. The components of device 705 may be in electronic communication with one another through bus 730.

Processor 710 may be configured to operate memory array 100-*a* through memory controller 140-*a*. In some cases, processor 710 may perform the functions of memory controller 140 described with reference to FIGS. 1 and 6. In other cases, memory controller 140-*a* may be integrated into processor 710. Processor 710 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components, and processor 710 may perform various functions described herein, including cell-specific reference generation and sensing. Processor 710 may, for example, be configured to execute computer-readable instructions stored in memory array 100-*a* to cause device 705 perform various functions or tasks.

BIOS component 715 may be a software component that includes a basic input/output system (BIOS) operated as firmware, which may initialize and run various hardware components of system 700. BIOS component 715 may also manage data flow between processor 710 and the various components, e.g., peripheral components 720, input/output control component 725, etc. BIOS component 715 may include a program or software stored in read-only memory (ROM), flash memory, or any other non-volatile memory.

Peripheral component(s) 720 may be any input or output device, or an interface for such devices, that is integrated into device 705. Examples may include disk controllers, sound controller, graphics controller, Ethernet controller, modem, USB controller, a serial or parallel port, or peripheral card slots, such as peripheral component interconnect (PCI) or accelerated graphics port (AGP) slots.

Input/output control component 725 may manage data communication between processor 710 and peripheral component(s) 720, input devices 735, or output devices 740. Input/output control component 725 may also manage peripherals not integrated into device 705. In some cases, input/output control component 725 may represent a physical connection or port to the external peripheral.

Input 735 may represent a device or signal external to device 705 that provides input to device 705 or its components. This may include a user interface or interface with or between other devices. In some cases, input 735 may be a peripheral that interfaces with device 705 via peripheral component(s) 720 or may be managed by input/output control component 725.

Output device 740 may represent a device or signal external to device 705 configured to receive output from device 705 or any of its components. Examples of output device 740 may include a display, audio speakers, a printing device, another processor or printed circuit board, etc. In some cases, output 740 may be a peripheral that interfaces with device 705 via peripheral component(s) 720 or may be managed by input/output control component 725.

The components of memory controller 140-*a*, device 705, and memory array 100-*b* may be made up of circuitry designed to carry out their functions. This may include various circuit elements, for example, conductive lines, transistors, capacitors, inductors, resistors, amplifiers, or other active or inactive elements, configured to carry out the functions described herein.

Figure 8:
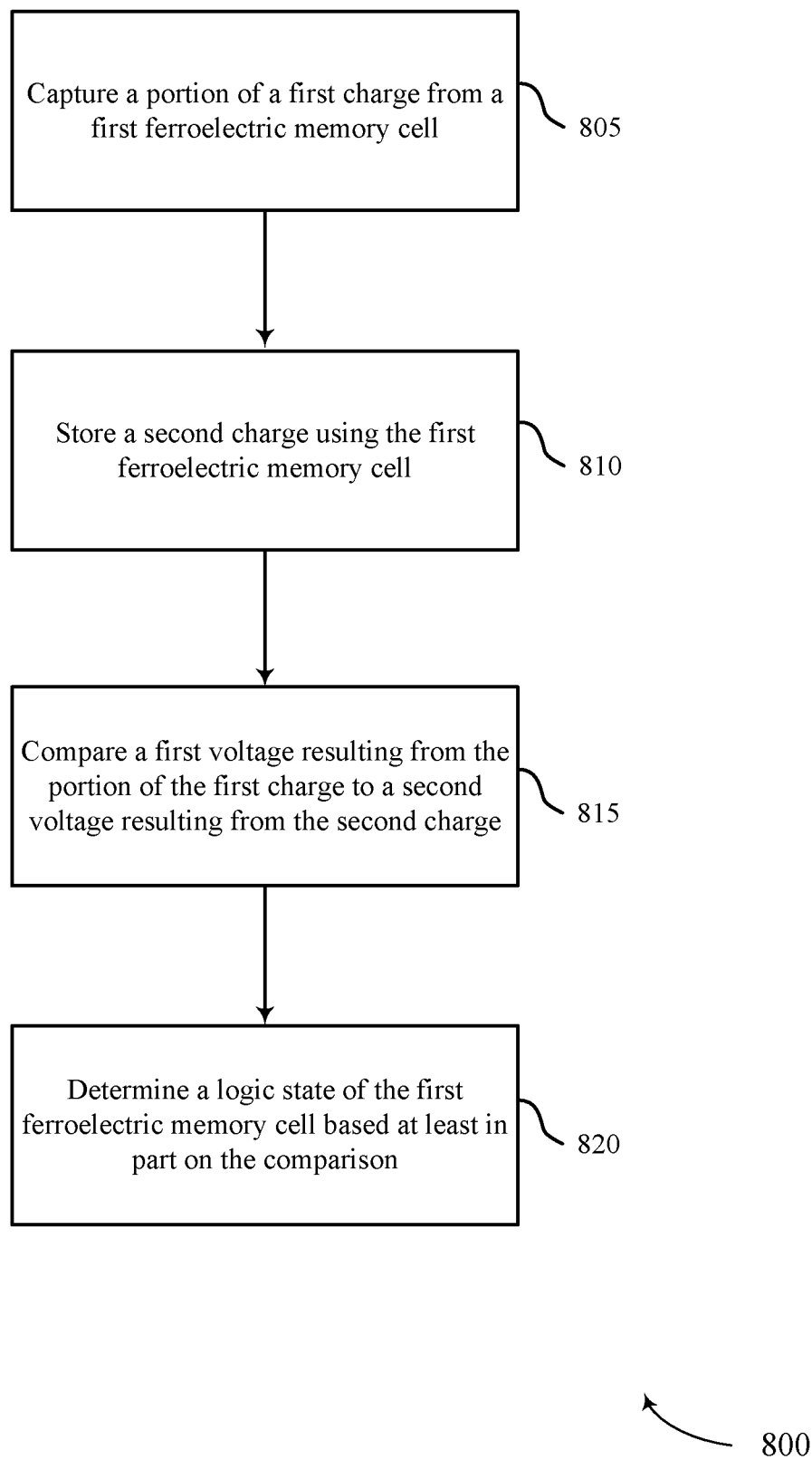
FIGS. 8 and 9 are flowcharts that illustrate methods for cell-specific reference generation and sensing in accordance with various embodiments of the present disclosure.

FIG. 8 shows a flowchart illustrating a method 800 for cell-specific reference generation and sensing in accordance with various embodiments of the present disclosure. The operations of method 800 may be implemented by a memory array 100, as described with reference to FIGS. 1, 6, and 7. For example, the operations of method 800 may be performed or facilitated by a memory controller 140, as described with reference to FIGS. 1 and 1, 6, and 7. In some examples, a memory controller 140 may execute a set of codes to control the functional elements of the memory array 100 to perform the functions described below. Additionally or alternatively, the memory controller 140 may perform aspects the functions described below using special-purpose hardware.

At block 805, the method may include capturing a portion of a first charge from a first ferroelectric memory cell. The first charge may be indicative or correspond to a logic 1 or 0. In some cases, capturing the portion of the first charge includes storing the portion of the first charge on a digit line of a second ferroelectric memory cell (e.g., by transferring the portion of the first charge from a digit line of the first ferroelectric memory cell to the digit line of the second ferroelectric memory cell). In certain examples, the operations of block 805 may be performed or facilitated by the memory controller 140, as described with reference to FIGS. 1, 6, and 7.

At block 810, the method may include storing a second charge using the first ferroelectric memory cell. The second charge may be a function of the first charge. For example, the second charge may correspond to a "weak" logic 0 or a "very weak" logic 0 that was stored using the first charge. Thus, a state associated with the second charge may correspond to an intermediary state between a logic 1 and a logic 0. In certain examples, the operations of block 810 may be performed or facilitated by the memory controller 140, as described with reference to FIGS. 1, 6, and 7.

At block 815, the method may include comparing a first voltage resulting from, or depending on, the portion of the first charge to a second voltage resulting from, or depending on, the second charge. In some cases, the second voltage is a reference voltage and the first voltage is the sensed voltage. In certain examples, the operations of block 815 may be performed or facilitated by the memory controller 140, as described with reference to FIGS. 1, 6, and 7.

At block 820, the method may include determining a logic state of the first ferroelectric memory cell based at least in part on the comparison. In some cases, determining the logic state is based at least in part on a value of the first voltage with respect to the reference voltage. In some cases, the logic state corresponds to a logic 1 or a logic 0. In certain examples, the operations of block 815 may be performed or facilitated by the memory controller 140, as described with reference to FIGS. 1, 6, and 7.

Figure 9:
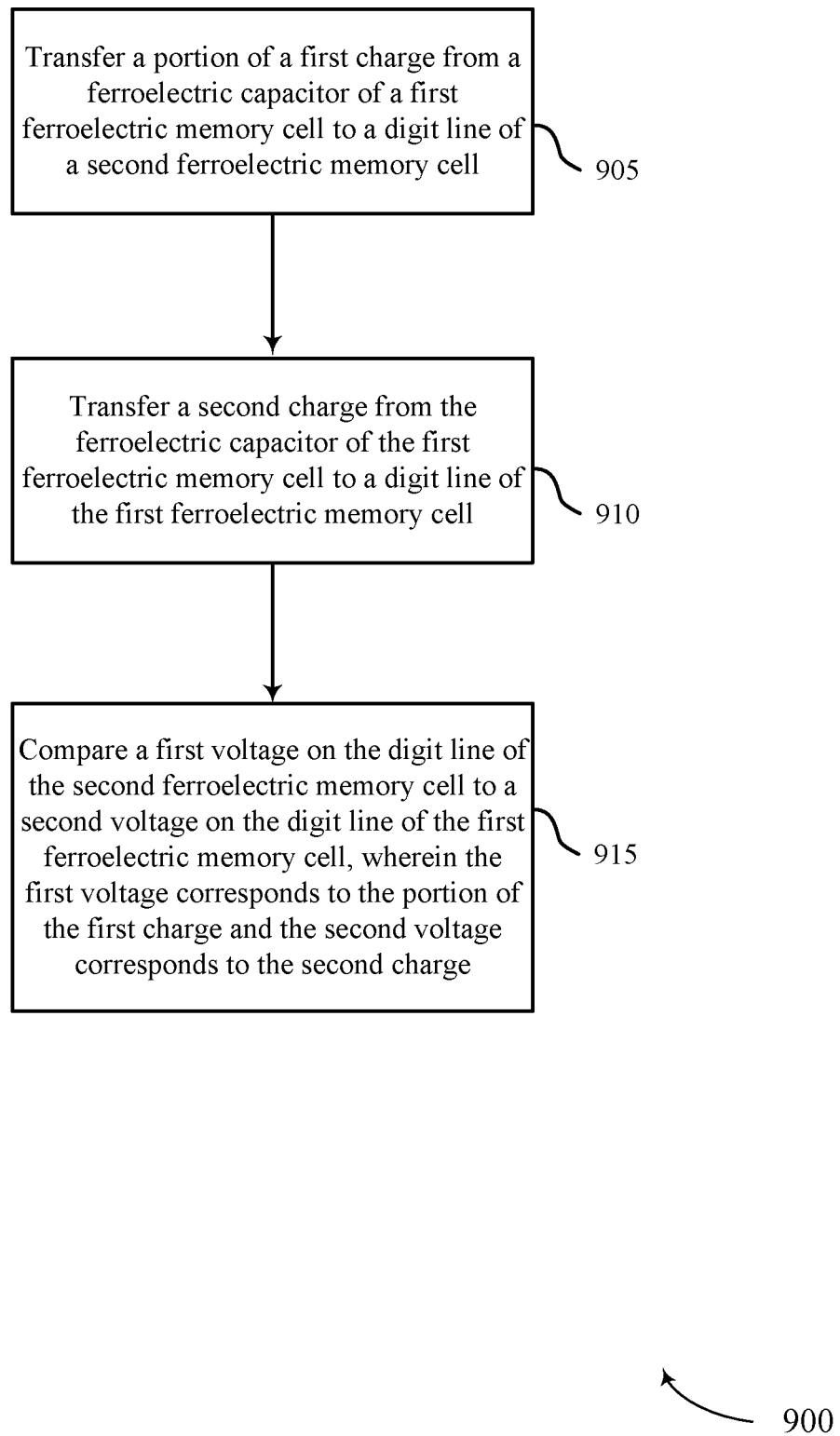

FIG. 9 shows a flowchart illustrating a method 900 for cell-specific reference generation and sensing in accordance with various embodiments of the present disclosure. The operations of method 900 may be implemented by a memory array 100, as described with reference to FIGS. 1, 6, and 7. For example, the operations of method 900 may be performed or facilitated by a memory controller 140, as described with reference to FIGS. 1, 6, and 7. In some examples, a memory controller 140 may execute a set of codes to control the functional elements of the memory array 100 to perform the functions described below. Additionally or alternatively, the memory controller 140 may perform aspects the functions described below using special-purpose hardware.

At block 905, the method may include transferring a portion of a first charge from a ferroelectric capacitor of a first ferroelectric memory cell to a digit line of a second ferroelectric memory cell. The second ferroelectric memory cell may be a reference memory cell. In some cases, the method also includes activating a switching component in electronic communication with the digit line of the first ferroelectric memory cell and the digit line of the second ferroelectric memory cell. The transfer of the portion of the first charge may be based at least in part on the activation of the switching component. In some examples, the method includes reducing a voltage applied to the ferroelectric capacitor of the first ferroelectric memory cell to a threshold value. The reduction may be based at least in part on the transfer of the portion of the first charge. In some cases, the method includes storing an intermediary state at the ferroelectric capacitor based at least in part on the reduced voltage. The intermediary state may correspond to the second charge and may represent "weak" logic 0 or a "very weak" logic 0 (e.g., an intermediary state between a logic 1 and a logic 0). In certain examples, the operations of block 905 may be performed or facilitated by the memory controller 140, as described with reference to FIGS. 1, 6, and 7.

At block 910, the method may include transferring a second charge from the ferroelectric capacitor of the first ferroelectric memory cell to a digit line of the first ferroelectric memory cell. In some cases transferring the second charge involves activating a selection component of the first ferroelectric memory cell and applying a voltage to a ferroelectric capacitor of the first ferroelectric memory cell. The voltage applied to the ferroelectric capacitor may be selected based at least in part on the first voltage of the digit line of the second ferroelectric memory cell. In certain examples, the operations of block 910 may be performed or facilitated by the memory controller 140, as described with reference to FIGS. 1, 6, and 7.

At block 915, the method may include comparing a first voltage on the digit line of the second ferroelectric memory cell to a second voltage on the digit line of the first ferroelectric memory cell, wherein the first voltage depends on (e.g., corresponds to) the portion of the first charge and the second voltage depends on (e.g., corresponds to) the second charge. In some examples, the second voltage serves as the reference voltage for the comparison. The value of the second voltage may be based at least in part on the voltage applied to the ferroelectric capacitor. In some cases, the method further includes determining a logic state stored by the first ferroelectric memory cell. The determination may be based at least in part on the comparison of the first voltage and the second voltage. In certain examples, the operations of block 915 may be performed or facilitated by the memory controller 140, as described with reference to FIGS. 1, 6, and 7.

Thus, methods 800 and 900 may provide for cell-specific reference generation and sensing. It should be noted that methods 800 and 900 describe possible implementations, and the operations and steps may be rearranged or otherwise modified such that other implementations are possible. In some examples, aspects from two or more of the methods 800 and 900 may be combined.

The description herein provides examples and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

The description set forth herein, in connection with the appended drawings, describes example configurations and does not represent all the examples that may be implemented or that are within the scope of the claims. The terms "example" and "exemplary," as used herein, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. When the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The term "electronic communication" refers to a relationship between components that supports electron flow between the components. This may include a direct connection between components or may include intermediate components. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication regardless of the state of the switch (i.e., open or closed). The term "isolated" refers to a relationship between components in which electrons are not presently flowing between the components. For example, two components physically connected by a switch may be isolated from each other when the switch is open.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The various illustrative blocks, components, and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk, and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. A method comprising:
   capturing, using a first digit line of a first ferroelectric memory cell, a first voltage from the first ferroelectric memory cell;
   coupling the first digit line with a second digit line of a second ferroelectric memory cell to share the first voltage between the first digit line and the second digit line;
   decoupling the first digit line and the second digit line to store a second voltage on the second digit line based at least in part on sharing the first voltage;
   capturing, using the first digit line, a third voltage from the first ferroelectric memory cell; and
   determining a logic state of the first ferroelectric memory cell by coupling the first digit line and the second digit line with a sense component.

2. The method of claim 1, further comprising:
   storing a fourth voltage on the first digit line based at least in part on decoupling the first digit line and the second digit line after sharing the first voltage; and
   storing the fourth voltage on the first ferroelectric memory cell, wherein capturing the third voltage is based at least in part on storing the fourth voltage on the first ferroelectric memory cell.

3. The method of claim 2, wherein the fourth voltage corresponds to an intermediary logic state associated with the logic state of the first ferroelectric memory cell.

4. The method of claim 1, further comprising:
   activating a selection component of the first ferroelectric memory cell, wherein capturing the first voltage and capturing the third voltage are based at least in part on activating the selection component.

5. The method of claim 1, wherein determining the logic state of the first ferroelectric memory cell comprises:
   comparing, at the sense component, the second voltage and the third voltage.

6. The method of claim 5, wherein:
   the second voltage corresponds to the logic state of the first ferroelectric memory cell; and
   the third voltage comprises a reference voltage corresponding to an intermediary logic state associated with the logic state of the first ferroelectric memory cell.

7. The method of claim 1, wherein coupling the first digit line with the second digit line comprises:
   activating a switching component coupled with the first digit line and the second digit line.

8. The method of claim 7, wherein decoupling the first digit line and the second digit line comprises:
   deactivating the switching component coupled with the first digit line and the second digit line.

9. An apparatus, comprising:
   a first ferroelectric memory cell couplable with a first digit line;
   a second ferroelectric memory cell couplable with a second digit line;
   a switching component configured to couple the first digit line with the second digit line to share, between the first digit line and the second digit line, a first voltage captured from the first ferroelectric memory cell using the first digit line; and
   a sense component configured to determine a logic state of the first ferroelectric memory cell using a second voltage stored on the second digit line and a third voltage stored on the first digit line, the second voltage and the third voltage based at least in part on sharing the first voltage between the first digit line and the second digit line.

10. The apparatus of claim 9, wherein the switching component is further configured to:

decouple the first digit line and the second digit line to store the second voltage on the second digit line and a fourth voltage on the first digit line.

11. The apparatus of claim 10, wherein the fourth voltage corresponds to an intermediary logic state associated with the logic state of the first ferroelectric memory cell.

12. The apparatus of claim 10, further comprising:
a selection component configured to couple the first digit line with the first ferroelectric memory cell to store the fourth voltage on the first ferroelectric memory cell, wherein the third voltage is based at least in part on the fourth voltage.

13. The apparatus of claim 12, wherein the selection component is configured to:
couple the first ferroelectric memory cell with the first digit line to capture the first voltage, or to capture the third voltage, or both.

14. The apparatus of claim 9, wherein:
the second voltage corresponds to the logic state of the first ferroelectric memory cell; and
the third voltage comprises a reference voltage corresponding to an intermediary logic state associated with the logic state of the first ferroelectric memory cell.

15. A memory device, comprising:
a first ferroelectric memory cell and a second ferroelectric memory cell;
a switching component;
a sense component; and
a controller in electronic communication with the first ferroelectric memory cell, the second ferroelectric memory cell, the sense component, and the switching component, wherein the controller is operable to:
capture, using a first digit line of the first ferroelectric memory cell, a first voltage from the first ferroelectric memory cell;
couple, via the switching component, the first digit line with a second digit line of the second ferroelectric memory cell to share the first voltage between the first digit line and the second digit line;
decouple, via the switching component, the first digit line and the second digit line to store a second voltage on the second digit line based at least in part on sharing the first voltage;
capture, using the first digit line, a third voltage from the first ferroelectric memory cell; and
determine a logic state of the first ferroelectric memory cell by coupling the first digit line and the second digit line to the sense component.

16. The memory device of claim 15, wherein decoupling the first digit line and the second digit line stores a fourth voltage on the first digit line based at least in part sharing the first voltage, the controller further operable to:
store the fourth voltage on the first ferroelectric memory cell after decoupling the first digit line and the second digit line, wherein capturing the third voltage is based at least in part on storing the fourth voltage on the first ferroelectric memory cell.

17. The memory device of claim 16, wherein the fourth voltage corresponds to an intermediary logic state associated with the logic state of the first ferroelectric memory cell.

18. The memory device of claim 15, wherein the first ferroelectric memory cell comprises a selection component, the controller further operable to:
activate the selection component, wherein capturing the first voltage and capturing the third voltage are based at least in part on activating the selection component.

19. The memory device of claim 15, wherein the controller is further operable to:
activate the sense component, wherein the sense component is configured to compare the second voltage and the third voltage.

20. The memory device of claim 19, wherein:
the second voltage corresponds to the logic state of the first ferroelectric memory cell; and
the third voltage comprises a reference voltage corresponding to an intermediary logic state associated with the logic state of the first ferroelectric memory cell.

* * * * *